United States Patent [19]

Sell

[11] E Patent Number: Re. 31,969

[45] Reissued Date of Patent: Aug. 13, 1985

[54] LASER CONTROL CIRCUIT

[75] Inventor: Darrell D. Sell, Los Gatos, Calif.

[73] Assignee: AT&T Bell Laboratories, Murray Hill, N.J.

[21] Appl. No.: 385,024

[22] Filed: Jun. 4, 1982

Related U.S. Patent Documents

Reissue of:

[64] Patent No.: 4,009,385
Issued: Feb. 22, 1977
Appl. No.: 668,824
Filed: Mar. 22, 1976

[51] Int. Cl.[3] ..... H01S 3/10; H04B 9/00

[52] U.S. Cl. ..... 372/38; 332/7.51; 455/610; 455/611; 372/26; 372/31

[58] Field of Search ..... 455/611, 610, 618; 332/7.51; 372/31, 26, 38

[56] References Cited

U.S. PATENT DOCUMENTS 3,898,583 8/1975 Shuey ..... 250/205
3,931,512 1/1976 Kent et al. ..... 455/612
4,008,390 2/1977 Runge ..... 455/612

FOREIGN PATENT DOCUMENTS 22255 3/1973 Japan .
107951 8/1975 Japan .
159686 12/1975 Japan .

OTHER PUBLICATIONS

Electronics Letters, Jan. 25, 1973, "Direct Modulation of Double-Heterostructure Lasers . . . " by M. Chown et al. pp. 34–36.

*Primary Examiner*—Howard W. Britton
*Attorney, Agent, or Firm*—Richard B. Havill

[57] ABSTRACT

A control circuit for an injection laser includes a driver circuit which applies a driving current to the laser in response to an electrical modulating signal. A prebias circuit applies a prebias current to the laser in response to the difference between a signal derived from the electrical modulating signal and a signal derived from the laser light output.

12 Claims, 1 Drawing Figure

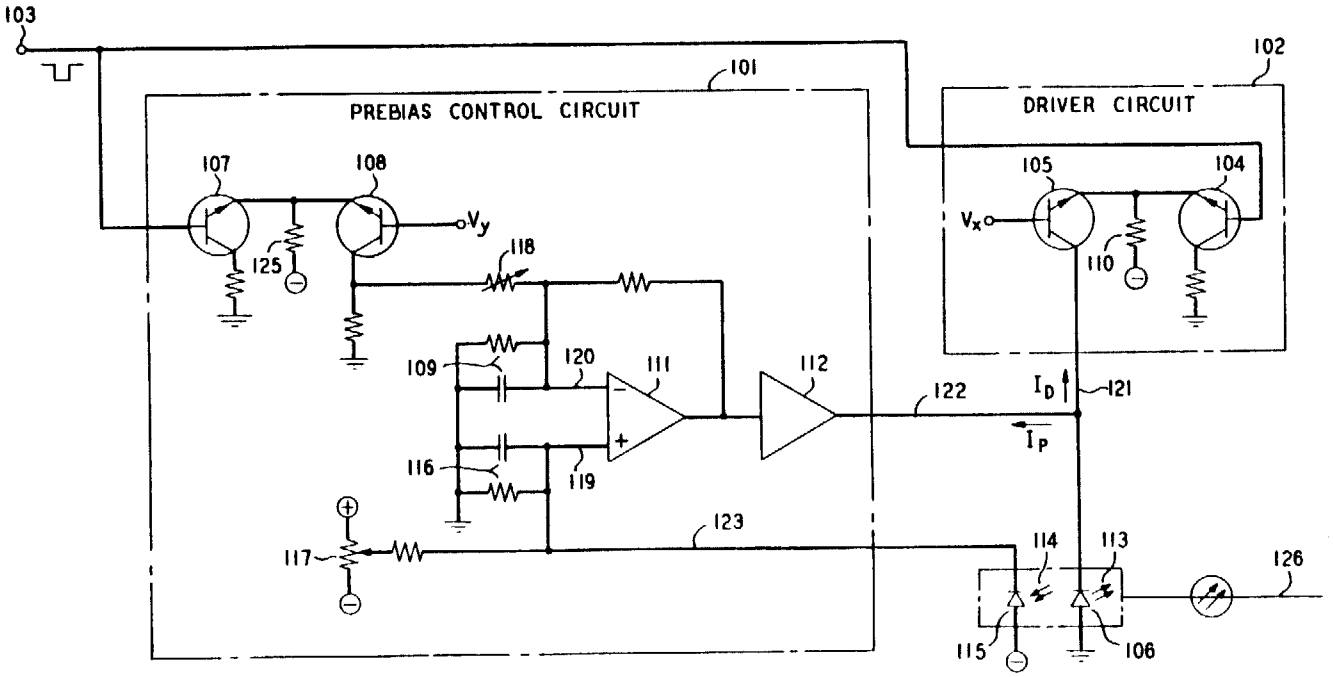
DRIVER CIRCUIT
PREBIAS CONTROL CIRCUIT
102
101
103
104
105
106
107
108
109
110
111
112
113
114
115
116
117
118
119
120
121
122
123
125
126
$V_x$
$V_y$
$I_D$
$I_P$

LASER CONTROL CIRCUIT

Matter enclosed in heavy brackets [ ] appears in the original patent but forms no part of this reissue specification; matter printed in italics indicates the additions made by reissue.

BACKGROUND OF THE INVENTION

This invention relates to control circuits, and particularly to an arrangement for controlling an injection laser.

Use of an injection laser in an optical transmission system requires that the laser be prebiased with a current which is smaller than the laser threshold current (point above which the lasing action starts). This is necessary to minimize the delay between the input of an electrical signal to a laser and the laser corresponding light output. Because the laser threshold current varies with temperature and age, the prebias current has to be correspondingly adjusted for the proper operation of a laser in an optical transmission system.

Prior art laser control circuits are arranged to accomplish this by sensing the optical, *such as the circuits in U.S. Pat. No. 3,898,583,* power output of a laser with a relatively slow feedback loop which averages the laser's optical power output over several time slots. A voltage derived from the optical power output is then compared to a fixed reference voltage by a difference amplifier which uses the difference to adjust its output and thus vary the prebias current. While such an arrangement provides an adequate adjustment of the prebias current to compensate for the threshold current variation, it has several shortcomings. When the density of light pulses in a laser light output varies, the prior art control circuit causes variations in the amplitudes of the individual light pulses. Furthermore, for an electrical input signal having a long string of digital zeroes or the removal of the input signal altogether, the prior art circuit causes the prebias current to increase so high that reapplication of the signal can cause irreversible damage to the laser.

Therefore, it is an object to provide an improved laser control circuit.

Another object is to provide a laser control circuit which maintains individual light pulses at a constant amplitude.

Yet another object is to provide a laser control circuit which prevents the laser from being irreversibly damaged in response to an electrical input signal.

These and other objects are realized in an illustrative emobodiment of the invention in which a control circuit for an injection laser includes a driver circuit which applies a driving current to the laser in response to an electrical modulating signal. A prebias current applies a prebias current to the laser in response to the difference between a signal derived from the electrical modulating signal and a signal derived from the laser light output.

A feature of the invention is the prebiasing of the laser in response to the difference between a signal derived from an electrical modulating signal and a signal derived from the laser light output.

Another feature of the invention is the prebiasing of the laser always below its threshold current.

BRIEF DESCRIPTION OF THE DRAWING

A better understanding of the invention may be derived from the following detailed description as that description is considered with respect to the attached drawing, which shows an illustrative embodiment of the invention.

DETAILED DESCRIPTION

In the drawing there is shown a laser control circuit which illustrates the principles of the invention. The control circuit is of a kind used in an optical transmitter [shown in the] *disclosed by* T. L. Maione et al. [Ser. No. 668851 filed concurrently with this application] *in U.S. Pat. No. 4,019,048.* An electrical digital data signal, which is to be converted to an optical signal, is applied via a terminal 103 simultaneously to a prebias control circuit 101 and a driver circuit 102. The driver circuit 102 establishes a driving current $I_D$ for a laser 106 in response to the applied electrical signal. The prebias circuit 101 establishes a prebias current $I_P$ for the laser 106 in response to the difference between a signal derived from the input signal and a signal derived from the laser 106 light output.

The laser control circuit is arranged to work with a negative electrical modulating signal input having digital ones ("ONES") and digital zeroes ("ZEROES"). A "ONE" signal is represented by a negative voltage that is close to ground potential. Application of a signal representing a "ONE" turns the laser 106 OFF (light OFF). A "ZERO" signal is more negative than the "ONE" signal. Application of a signal representing a "ZERO" turns the laser 106 ON (light ON).

In operation of the driver circuit 102, a "ONE" signal is applied via the terminal 103 to the base of a transistor 104. The emitter of transistor 104 is coupled to the emitter of a transistor 105, which transistor has substantially the same electrical characteristics as transistor 104. Transistors 104 and 105 make up a symmetric emitter-coupled pair of NPN transistors having a common emitter resistor 110 connected between their emitters and a negative potential source.

The "ONE" signal applied to the base of transistor 104 causes its base voltage to become more positive than a reference voltage $V_X$ which is applied to the base of transistor 105. This causes transistor 104 to turn ON and transistor 105 to turn OFF. When transistor 105 is OFF, no driving current $I_D$ is conducted through a lead 121 connecting the collector of transistor 105 to the cathode of laser 106 and the laser does not lase.

Application of a "ZERO" signal to the base of the transistor 104 causes the transistor's base voltage to become more negative than the reference signal voltage $V_X$ on the base of transistor 105. This causes transistor 104 to turn OFF and transistor 105 to turn ON. When transistor 105 is ON, a driving current $I_D$ of a predetermined magnitude is conducted from ground through the laser 106, the lead 121, the transistor 105 and the resistor 110 to the negative potential source. The magnitude is such that the sum of the driving current $I_D$ and the prebias current $I_P$ conducted through the laser 106 exceeds the laser's threshold current and thus biases the laser to lase.

In the prebias circuit 101, electrical modulating signals are applied via the terminal 103 to the base of a transistor 107. The emitter of transistor 107 is coupled to the emitter of a transistor 108, which transistor has substantially the same electrical characteristics as transistor 107. Transistors 107 and 108 make up a symmetric emitter-coupled pair of NPN transistors having a common emitter resistor 125 connected between their emitters and a negative potential source.

Each "ONE" signal applied to the base of transistor 107 causes its base voltage to become more positive than a reference voltage $V_Y$ applied to the base of transistor 108. This causes transistor 107 to turn ON and transistor 108 to turn OFF. When transistor 108 is OFF, its collector is held at ground potential. No current is conducted through a variable resistor 118 and the voltage derived from the electrical modulating signal on a lead 120, which is one of the inputs to a difference amplifier 111, also is held at ground potential. The other input lead 119 to the difference amplifier 111 has a potential on it caused by a current conducted through a potentiometer 117 and a filter network 116 to ground. The potentiometer 117 has one of its terminals connected to a negative potential source and its second terminal connected to a positive voltage source.

The difference amplifier 111 has a high gain that produces a current output proportional to an infinitesimal difference between its two voltage inputs. The difference amplifier 111, responding to the voltage difference present between the two input leads 119 and 120, produces a current output which is amplified by a power amplifier 112. The output of the amplifier 112 is the prebias current $I_P$ which is conducted from ground through the laser 106 and the lead 122 into the amplifier 112.

This prebias current $I_P$, which is smaller than the laser threshold current, causes the laser to act as a light-emitting diode, so that some light will be emitted by the laser and detected by a reverse biased PIN photodiode 115. The photodiode 115 converts this light into a current which is conducted through filter 116 and thereby contributes to voltage signal on lead 119. For initial operation in response to series of "ONES", the wiper on resistor 117 is adjusted to a point where the magnitude of the voltage on the lead 119 produces a prebias current $I_P$ of the required magnitude just below the threshold current of the laser.

Application of the "ZERO" signal to the base of transistor 107 causes its voltage to become more negative than the reference voltage $V_Y$ on the base of transistor 108. This causes transistor 107 to turn OFF and transistor 108 to turn ON. With transistor 108 in the ON state, a current is conducted from ground through a filter network 109, a variable resistor 118, and the transistor 108 to the source of negative potential causing a negative voltage on the input lead 120.

Once the prebias current $I_P$ is established, an electrical signal having half "ZEROES" and half "ONES" in a pseudorandom arrangement is applied via terminal 103 to the bases of transistors 104 and 107. Application of a "ZERO" signal to the base of the transistor 104 turns the laser 106 "ON". The laser 106 will have a light output 113 through its front mirror and a light output 114 through its back mirror. Light output 113 can be injected into an optical fiber 126 for transmission to some distant point.

Light output 114 impinges upon the PIN photodiode 115 and is converted into an electrical current which is conducted from ground through the filter network 116, the lead 123 and the photodiode 115 to a source of negative potential. This current input through the filter network 116 causes a negative voltage level on the input lead 119 to the difference amplifier 111. At the same time, however, a negative voltage of substantially the same magnitude is effected on the input lead 120 to the difference amplifier 111 because of current conducted through the filter 109, resistor 118 and the transistor 108. Resistor 118 is adjusted so that the varying voltage derived from the electrical modulating signal on the input lead 120 matches the varying voltage on the input lead 119 derived from the laser light output. Thus, the difference between the two voltage signals on the input leads 119 and 120, respectively, will not change, and consequently the prebias current will remain substantially constant.

As previously mentioned, the application of a "ONE" signal to the base of transistor 104 causes it to turn ON and transistor 105 to turn OFF. This removes the driving current $I_D$ from the laser 106 and puts the laser in a nonlasing state which results in a decrease in the light output 114 from the laser, and reduced current input into the filter network 116. With such reduced current, the charge on the capacitor in the filter network 116 begins to decay to a new equilibrium value, and the negative voltage on the lead 119 becomes more positive. At the same time, however, application of the "ONE" signal to the base of the transistor 107 turns it ON and turns transistor 108 OFF, with the result that there is no current input into the filter network 109. The charge on the capacitor in the filter network 109 also begins to decay, and the negative voltage on the lead 120 becomes more positive. Because the time constants of both capacitors are substantially the same, the voltages on both leads 119 and 120 decrease together. Consequently, the prebias current $I_P$ will remain substantially constant. Therefore, once the initial adjustment for the [pebias] *prebias* current is made, the [pebias] *prebias* current will now change with the density of light pulses or absence of light pulses.

During a continuous operation of the laser the threshold current will move upward with an increase in the laser temperature. The laser control circuit adjusts the prebias current $I_P$ in the following manner. When the threshold current of the laser increases, the optical power output of the laser decreases, and the current conducted through the PIN photodiode 115 and the filter network 116 decreases causing the negative voltage on the input lead 119 to become more positive. The difference amplifier 111, reacting to the difference between the two input voltages to the amplifier, adjusts the prebias current $I_P$ upward to increase the optical power output of the laser to its previous level. Should the threshold point move downward, just the opposite takes place. Optical power output increases, and the current conducted through the photodiode 115 and the filter network 116 increases causing an increase of the negative voltage level on lead 119. The different amplifier 111, reacting to the difference between the input voltages, adjusts the prebias current downward.

It is to be understood that the above-described arrangement is illustrative of the application of the principles of the invention. As various changes could be made in the above-described arrangement without departing from the scope of the invention, it is intended that all matter contained in the above description or shown in the accompanying drawing shall be interpreted as illustrative and not in a limiting sense.

What is claimed is:

1. A control circuit for an injection laser, the circuit comprising;

means for driving the laser in response to an electrical modulating signal, and means for prebiasing the laser in response to the difference between a signal derived from the electrical modulating signal and a signal derived from the laser light output.

2. The circuit as defined in claim 1, wherein the prebiasing means always biases the laser below its threshold current.

3. The circuit as defined in claim 1, wherein the driving means include a symmetric emitter-coupled pair of transistors conducting a driving current through the laser.

4. A control circuit for an injection laser comprising:

means for conducting a driving current through the laser in response to [the] *an* electrical modulating signal, amplifier means having input and output terminals, means for deriving a first voltage input to the amplifier from [an] *the* electrical modulating signal, means for deriving a second voltage input to the amplifier from the laser optical output, and means for conducting a current through the laser and the amplifier in response to the difference between the first and second voltage inputs to the amplifier.

5. The circuit as defined in claim 4, wherein the current conducted through the amplifier means always prebiases the laser below its threshold current.

6. The circuit as defined in claim 4, wherein the means for deriving the first voltage input to the amplifier includes a symmetric emitter-coupled pair of transistors responsive to the electrical modulating signal for establishing a prebias current of a predetermined magnitude.

*7. A control circuit for an injection laser, the circuit comprising:*

*means for driving the laser in response to an electrical modulating signal, and*

*means for prebiasing the laser in response to a difference between a signal derived from the magnitude of the electrical modulating signal and a signal derived from the magnitude of the laser light output.*

*8. The circuit as defined in claim 7, wherein the prebiasing means biases the laser below its threshold current.*

*9. The circuit as defined in claim 7, wherein the driving means include a symmetric emitter-coupled pair of transistors for conducting a driving current through the laser.*

*10. A control circuit for an injection laser comprising:*

*means for conducting a driving current through the laser in response to an electrical modulating signal,*

*amplifier means having input and output terminals,*

*means for deriving a first voltage input to the amplifier from the magnitude of the electrical modulating signal,*

*means for deriving a second voltage input to the amplifier from the magnitude of the laser optical output, and*

*means for conducting a current through the laser and the output terminal of the amplifier in response to the difference between the first and second voltage inputs to the amplifier.*

*11. The circuit as defined in claim 10, wherein the current conducted through the amplifier means always prebiases the laser below its threshold current.*

*12. The circuit as defined in claim 10, wherein the means for deriving the first voltage input to the amplifier includes a symmetric emitter-coupled pair of transistors responsive to the electrical modulating signal for establishing a prebias current of a predetermined magnitude.*

* * * * *